United States Patent
Tee et al.

(10) Patent No.: US 6,319,772 B1
(45) Date of Patent: Nov. 20, 2001

(54) METHOD FOR MAKING LOW-LEAKAGE DRAM STRUCTURES USING SELECTIVE SILICON EPITAXIAL GROWTH (SEG) ON AN INSULATING LAYER

(75) Inventors: Kheng Chok Tee, Selangor (MY); Randall Cher Liang Cha, Singapore (SG); Lap Chan, San Francisco, CA (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/697,946

(22) Filed: Oct. 30, 2000

(51) Int. Cl.[7] .................................................. H01L 21/8242
(52) U.S. Cl. ........................... 438/256; 438/300; 438/481
(58) Field of Search .................................... 438/253, 256, 438/300, 396, 399, 481

(56) References Cited

U.S. PATENT DOCUMENTS

| | | | |
|---|---|---|---|
| 5,045,494 | * 9/1991 | Choi et al. | 438/256 |
| 5,681,776 | 10/1997 | Hebert et al. | 437/72 |
| 5,686,343 | 11/1997 | Lee | 437/62 |
| 5,731,217 | * 3/1998 | Kadosh et al. | 438/300 |
| 5,763,314 | 6/1998 | Chittipeddi | 438/400 |
| 6,037,199 | 3/2000 | Huang et al. | 438/166 |
| 6,107,154 | * 8/2000 | Lin | 438/300 |

* cited by examiner

*Primary Examiner*—Chandra Chaudhari
(74) *Attorney, Agent, or Firm*—George O. Saile; Rosemary L. S. Pike

(57) ABSTRACT

Low current leakage DRAM structures are achieved using a selective silicon epitaxial growth over an insulating layer on memory cell (device) areas. An insulating layer, that also serves as a stress-release layer, and a $Si_3N_4$ hard mask are patterned to leave portions over the memory cell areas. Shallow trenches are etched in the substrate and filled with a CVD oxide which is polished back to the hard mask to form shallow trench isolation (STI) around the memory cell areas. The hard mask is selectively removed to form recesses in the STI aligned over the memory cell areas exposing the underlying insulating layer. Openings are etched in the insulating layer to provide a silicon-seed surface from which is grown a selective epitaxial layer extending over the insulating layer within the recesses. After growing a gate oxide on the epitaxial layer, FETs and DRAM capacitors can be formed on the epitaxial layer. The insulating layer under the epitaxial layer drastically reduces the capacitor leakage current and improves DRAM device performance. This self-aligning method also increases memory cell density, and is integratable into current DRAM processes to reduce cost.

35 Claims, 4 Drawing Sheets

US 6,319,772 B1

METHOD FOR MAKING LOW-LEAKAGE DRAM STRUCTURES USING SELECTIVE SILICON EPITAXIAL GROWTH (SEG) ON AN INSULATING LAYER

BACKGROUND OF THE INVENTION (1) Field of the Invention

The present invetnion relates to the fabrication of integrated circuit devices on semiconductor substrates, and more particularly relates to a method for fabricating Dynamic Random Access Memory (DRAM) cells using selective silicon epitaxial growth over an insulating layer on the cell (device) areas. The method is particulary useful for reducing capacitor leakage currents and soft error due to Alpha particles on DRAM cells.

(2) Description of the Prior Art

Advances in the semiconductor process technologies have dramatically decreased the demiconductor device feature sizes and increased the circuit density on the integrated circuits on chips. One device type that has experienced a rapid increase in density is the array of memory cells on DRAM devices. Each memory cell consists of a single pass transistor (FET) and a storage capacitor. As the cell area decreases and the capacitance of the storage capacitor decreases, it becomes increasingly difficult to maintain sufficient charge on the capacitor due to the capacitor leakage current, and the refresh cycle time needed to maintain the charge on the capacitor becomes unacceptably short. Another problem is the natural presence of Alpha particles, which can generate electron-hole pairs resulting in soft errors in the more conventional DRAM capacitors in which their node contacts are made directly to the diffused junctions in the silicon substrate.

One method of reducing the leakage current and reducing soft error is to use a silicon-on-insulator (SOI). However, SOI technology is still too expensive and complicated for manufacturing. However, as devices are further diminished in size, the junction depths and well depths decrease proportionally. The use of a thin silicon epitaxial layer is required for future device generations to achieve these shallow device structures.

Several methods for making and using SOI have been described in the literature. For example, in U.S. Pat. No. 5,691,776 to Hebert et al. a method is described for forming field oxide regions by etching trenches in which a conformal silicon nitride ($Si_3N_4$) is deposited over the trenches. An opening is etched in the $Si_3N_4$ layer and a selective epitaxial growth (SEG) is used to partially fill the trenches. The SEG is then thermally oxidized to form the field oxide. In U.S. Pat. No. 5,686,343 to Lee, Lee isolates a semiconductor layer on an insulator by first forming an insulating layer on a silicon substrate, etching a window to the substrate, depositing an amorphous silicon layer that is annealed to form an epitaxial layer over the window. The epitaxial layer is patterned and a $Si_3N_4$ layer is deposited over the patterned epitaxial layer, and a thermal oxidation is used to oxidize the silicon in the window under the semiconductor layer. In U.S. Pat. No. 6,037,199 to Huang et al. an insulating layer is formed on a silicon substrate, an opening is formed in the insulator, and an amorphous silicon layer is deposited and annealed to form an epitaxial layer extending from the opening laterally over the insulating layer. The epitaxial layer is patterned over the insulating layer to form isolated silicon regions (islands) in which FETs are forme. In. U.S. Pat. No. 5,763,314 to Chittipeddi a method is described for forming two separate selective epitaxial layers, having different dopant concentrations, on the same silicon substrate. The epitaxial layers are separated by a trench filled with an insulating material.

However, there is still a strong need in the semiconductor industry to provide DRAM cells with low capacitor-leakage currents and reduced Alpha soft errors while providing a process that is integratable into the current manufacturing process without significantly increasing manufacturing process complexity.

SUMMARY OF THE INVENTION

Therefore a principal object of this invention is to make DRAM cells with increased cell density while reducing capacitor leakage currents.

Another object of this invention is to reduce the leakage currents and soft error by using a silicon epitaxial layer over an insulating layer on which are formed the DRAM FETs and storage capacitors.

It is another object to integrate this novel DRAM cell into the current DRAM process to minimize manufacturing cost by integrating the selective silicon epitaxy on insulator without significantly increasing the processing steps.

Another objective of this invention by a first embodiment is to make a flat capacitor structure using this selective epitaxy DRAM process having low leakage currents.

Still another objective of this invention by a second embodiment is to make a stacked capacitor structure using this selective epitaxy DRAM process having low leakage currents.

In accordance with the objects of the present invention a method for fabricating dynamic random access memory (DRAM) cells on and in an epitaxial silicon layer formed over a first insulating layer on a semiconductor substrate is described. The method by a first embodiment begins by providing a P doped single-crystal silicon semiconductor substrate for N channel FETs. Alternatively an N doped substrate can be used if P channel FETs are desired. A first insulating layer that also serves as a stress-release layer is formed on the substrate. A hard-mask layer composed of $Si_3N_4$ is deposited on the first insulating layer. The hard mask is patterned to leave portions over the desired device areas. The hard mask and plasma etching are then used to etch shallow trenches in the substrate that are aligned to the hard mask (cell or device areas). A second insulating layer is deposited to a thickness sufficient to fill the shallow trenches and is polished back to the hard-mask layer to form shallow trench isolation and to expose the hard-mask surface. The hard-mask layer is selectively removed, such as by wet etching in a hot phosphoric acid solution. This results in recesses in the field oxide isolation that are self-aligned over the device areas and also exposes the first insulating (stress-release) layer in the recesses. Next, openings are etched in the first insulating layer over the device areas to expose the substrate. For example, the bit line contact mask can be used to etch the openings, thereby saving additional mask cost. Next, an epitaxial layer is selectively grown from the silicon substrate exposed in the openings and extends laterally over the first insulating layer in the recesses. By the method of a first embodiment, a portion of the epitaxial layer is doped N+ over the first insulating layer to form capacitor bottom electrodes in regions where flat capacitors are to be formed for the DRAM cells. A thin gate oxide is formed on the epitaxial layer, for example by thermal oxidation. A polysilicon layer is deposited on the substrate and is doped N+ by ion implantation. The polysilicon layer is then patterned to form FET gate electrodes over the openings in the first insulating layer and also to form capacitor top electrodes for the capacitors over the capacitor bottom electrodes. The FET thin gate oxide also serves as an interelectrode dielectric layer for the flat capacitor. In addition, the polysilicon layer can be concurrently patterned to form polysilicon resistors on the shallow trench isolation. Lightly doped source/drain areas are formed in the epitaxial layer adjacent to the gate electrodes, and insulating sidewall spacers are then formed on the gate electrodes. The DRAM FETs are now completed by forming first and second soarce/drain contact areas, one on each side of the FET gate electrode adjacent to the sidewall spacers, by ion implantation. The dopant regions in the first souirce/drain contact areas are contiguous with the doped capacitor bottom electrodes Bit line electrical contacts are formed to the second source/drain areas to complete the DRAM cells.

In the second embodiment the prosses is identical to the first embodiment up to and including the deposition of the polysilicon layer to form the gate electrodes. The implant to form the bottom electrodes of the flat capacitors in the first embodiment is optional in the second embodiment, and can be eliminated to reduce process cost. The polysilicon layer is then patterned to form only the FET gate electrodes over the openings in the first insulating layer. The $N^-$ lightly doped source/drain areas in the epitaxial layer are implanted adjacent to the gate electrodes. Insulating sidewall spacers are formed on the gate electrodes, and $N^+$ doped first and second source/drain contact areas are formed in the epitaxial layer adjacent to the sidewall spacers by ion implantation to complete the FETs. Continuing with the second embodiment, the stacked capacitors are formed next. A first interpolysilicon oxide (IPO1) layer is deposited, and first contact openings are etched in the IPO1 to the first source/drain contact areas. Capacitor node contacts are formed in the first contact openings, for example by depositing an $N^+$ doped polysilicon layer and polishing back. The stacked capacitors are then formed over the node contacts by various means, as commonly practiced in the industry. A second interpolysilicon oxide (IPO2) layer is deposited, and second contact openings for bit lines are etched to the second source/drain contact areas. Conducting plugs are formed in the second openings, and a conducting layer is deposited and patterned to form the bit lines to complete the array of DRAM cells having stacked capacitors. In both embodiments the first insulating layer, utilized as a stress-release layer for the hard-mask layer, is also used under the epitaxial layer. The dual use of the first insulating layer results in reduced process cost while reducing the capacitor leakage current to the substrate.

BRIEF DESCRIPTION OF THE DRAWINGS

The objects and other advantages of the invention will become more apparent in the preferred embodiments when read in conjunction with the following drawings.

DESCRIPTION OF THE PREFERRED EMBODIMENTS

The method for making the DRAM cells by a first embodiment using the selective epitaxial silicon layer over an insulating layer is now described in detail. The method and structure are applicable to both simple flat band or stacked capacitor DRAM devices. This novel structure can also be used for transistors, in general, to reduce leakage current.

Figure 1:
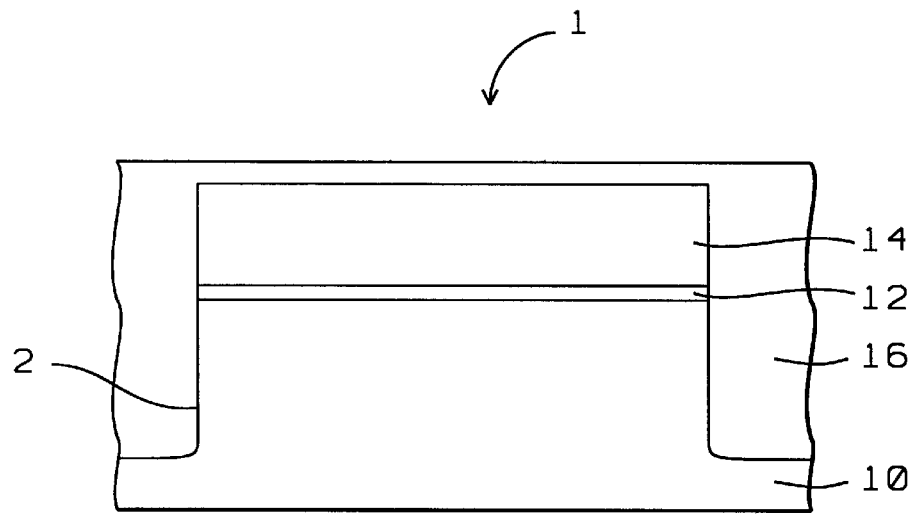
FIGS. 1 through 9 show schematically cross-sectional views of one of the memory cells for the sequence of process steps for making the DRAM cell by the first embodiment using the selective epitaxial grown layer on an insulator.

Referring to FIG. 1, the method by a first embodiment begins by providing a P doped single-crystal silicon substrate 10 having a <100> crystallographic orientation. A first insulating layer 12 comprised of silicon oxide ($SiO_2$) is formed either by thermal oxidation or by low-pressure chemical vapor deposition (LPCVD). Layer 12 serves as a stress-release layer for a $Si_3N_4$ hard mask and is also essential to the current invention as will become obvious at a later step. The $SiO_2$ first insulating layer 12 is formed to a preferred thickness of between about 100 and 200 Angstroms. A hard-mask layer 14, composed of $Si_3N_4$, is deposited on the first insulating layer 12. The $Si_3N_4$ layer 14 is deposited by LPCVD to a preferred thickness of between about 1600 and 2000 Angstroms. Photolithographic techniques and anisotropic plasma etching are used to pattern the hard mask to leave portions over the desired device areas 1. The $Si_3N_4$ is patterned using reactive ion etching (RIE) and an etchant gas mixture such as $CF_4$, $O_2$, and $CHF_3$, or a mixture such as $HBr$, $SF_6$, and $O_2$. With the photoresist mask (not shown) still in place shallow trenches 2 are plasma etched in the substrate 10. The shallow trenches are plasma etched using RIE and an etchant gas mixture such as $Cl_2$, $HBr$, and $O_2$ to a preferred depth of between about 2000 and 3300 Angstroms. After removing the photoresist mask, for example by plasma ashing in oxygen, a second insulating layer 16 is deposited to a thickness sufficient to fill the shallow trenches 2, and more particularly to a thickness that is at least greater than 6300 Angstroms, as shown in FIG. 1. The second insulating layer 16 is preferably composed of $SiO_2$, deposited by LPCVD or by high-density plasma deposition, using a reactant gas such as tetraethosiloxane (TEOS).

Figure 2:
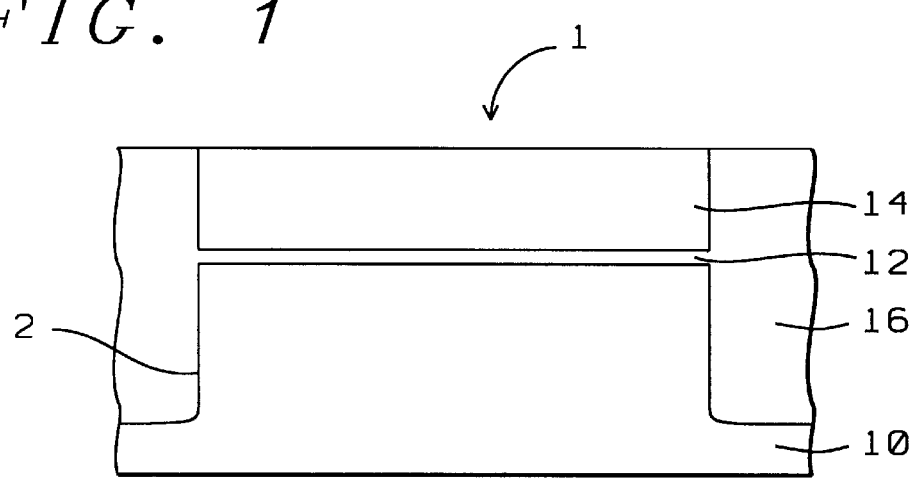

Referring to FIG. 2, the second insulating layer 16 is chemically-mechanically pnlished (CMP) back to the hard-mask layer 14 to form the shallow trench isolation 16 and to expose the surface of the hard mask over the device areas 1.

Figure 3:
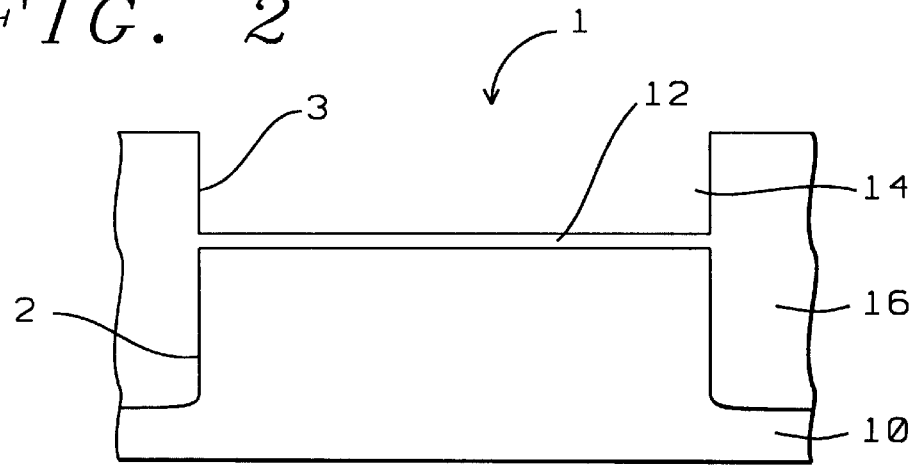

Referring to FIG. 3, the $Si_3N_4$ hard-mask layer 14 is selectively removed, for example by using a wet etching in a hot phosphoric acid ($H_3PO_4$) solution at a temperature of about 120 to 200° C. This results in recesses 3 in the field oxide isolation 16 that have a depth that is equal to the thickness of the $Si_3N_4$ layer 14. The recesses 3 are self-aligned over the device areas 1 and the first insulating layer 12 is exposed in the recesses.

Figure 4:
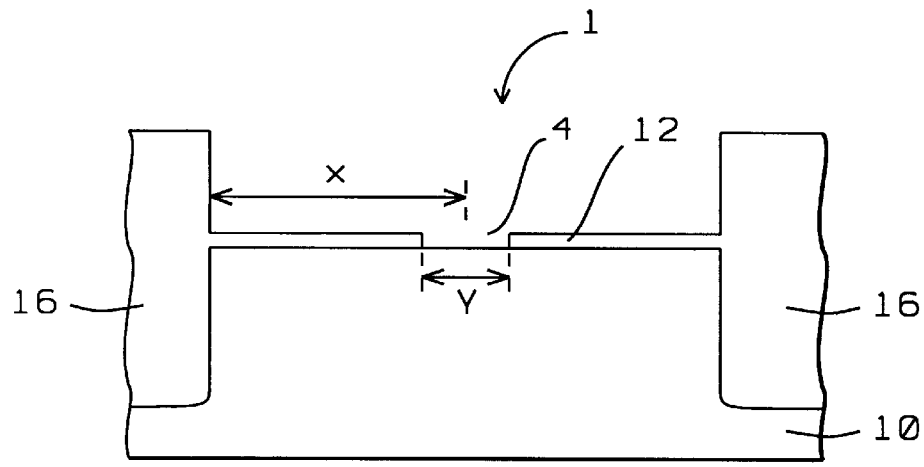

Referring to FIG. 4, openings 4 are etched in the first insulating layer 12 over the device areas 1 to expose the substrate 10. The openings are etched using a patterned photoresist layer and high-density plasma (HDP) etching using an etchant gas such as $CHF_3$, $C_4F_8$, or $CH_2F_2$ that selectively etches the $SiO_2$ layer 12 to the substrate. The openings 4 have a diameter or width y that is preferably between about 0.1 and 0.5 micrometers (um). The single-crystal silicon substrate surface in the openings serves as the single-crystal-seed surface having a <100> crystallographic orientation for the epitaxial layer that is grown in the next step. The distance x from the center of the opening 4 to the edge of the shallow trench 16 has a minimum width of about 0.2 um and is sufficiently wide to accommodate the flat capacitor for the DRAM device. For example, the bit line contact mask for the DRAM process can be used to etch the openings 4, thereby saving processing cost.

Figure 5:
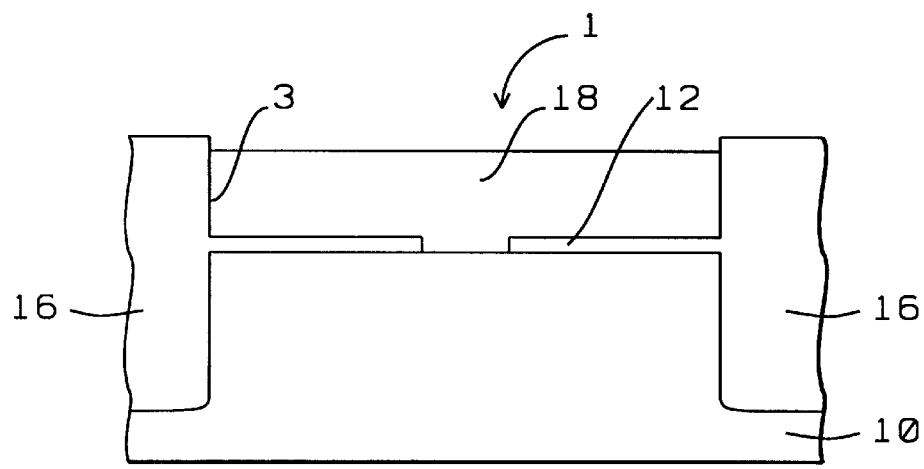

Referring to FIG. 5, an epitaxial layer 18 is selectively grown from the seed surface of the silicon substrate 10 in the openings 4 and extending laterally over the first insulating layer 12 in the recesses 3. The epitaxial layer 18 is grown in an epitaxial reactor (CVD system) at high temperature. Typically the selective epitaxial layer 18 is grown using a reactant gas such as $SiH_4$ or $SiH_2Cl_2$ at a temperature of between about 950 and 1100° C. The epitaxial layer 18 is doped P type using diborane hydride ($B_2H_6$) and to a preferred concentration of between about 1.0 E 16 and 1.0 E 18 atoms/cm$^3$. Epitaxial layer 18 is grown to a preferred thickness that is less than the depth of the recess 3 in the field oxide 16, and more specifically to a thickness of about 1000 to 5000 Angstroms. The epitaxial layer 18 is selectively grown on the first insulating layer 12 and if necessary can be wet etched back to the desired thickness.

Figure 6:
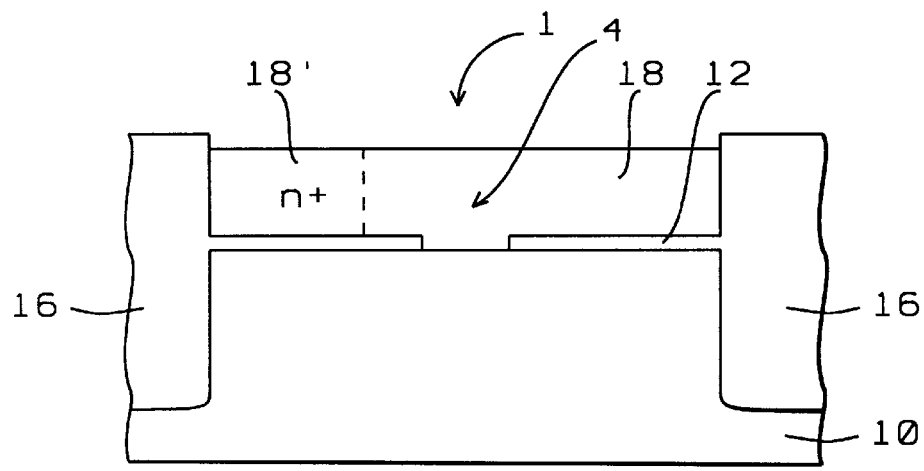

Referring to FIG. 6, by the method of a first embodiment, a portion of the P doped epitaxial layer 18 is doped N$^+$ to form capacitor bottom electrodes 18' in regions where the flat capacitors are to be formed for the DRAM cells. The epitaxial layer is doped by using a photoresist ion implant block-out mask and is implanted with arsenic or phosphorus ions to a final dopant concentration of between about 1.0 E 19 and 4.0 E 21 atoms/cm$^3$. As shown in FIG. 6, the capacitor bottom electrodes 18' are formed over the first insulating layer 12 and away from the opening 4 to reduce capacitor leakage current.

Figure 7:
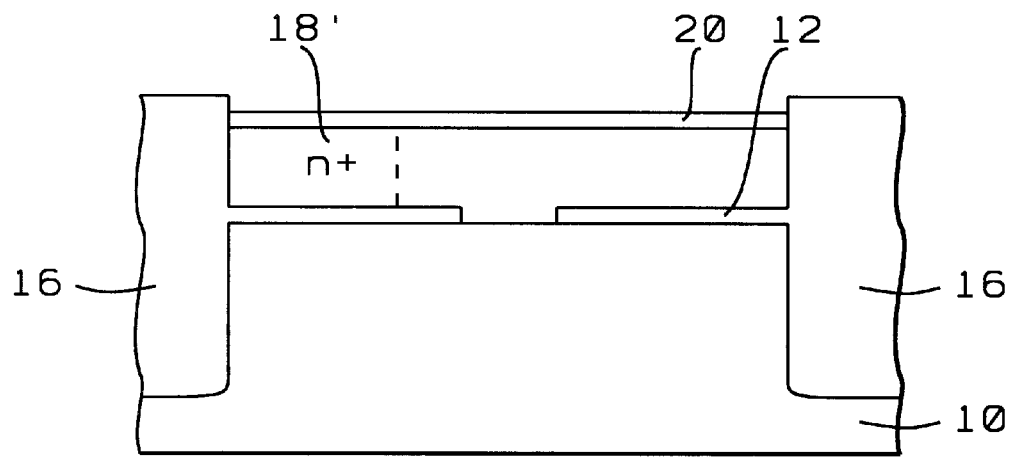

Referring to FIG. 7, a thin gate oxide 20 is formed on the epitaxial layer 18. For example, the oxide 20 is formed by a dry thermal oxidation to a thickness of between about 15 and 35 Angstroms. Alternatively, for future technologies more advanced gate dielectric layers, such as $Si_3N_4$, $TaO_x$, and the like can be used, and the thickness of which would be technology-dependent.

Figure 8:
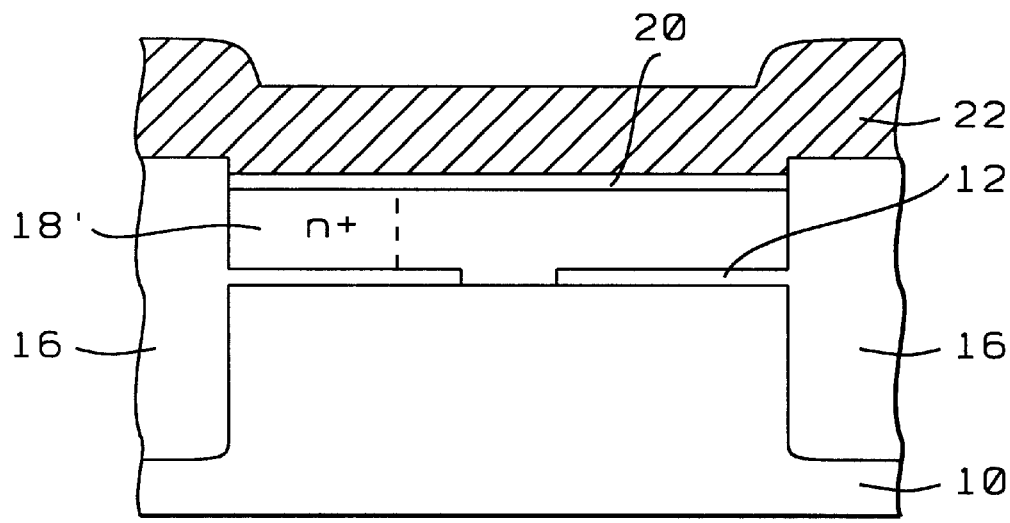

Referring to FIG. 8, a blanket polysilicon layer 22 is deposited on the substrate. Layer 22 is deposited by LPCVD using a reactant gas such as silane ($SiH_4$), and to a thickness of between about 1000 and 2000 Angstroms. The polysilicon layer 22 is then doped N$^+$ by ion implanting phosphorus ($p^{31}$) to achieve a final dopant concentration of between about 1.0 E 19 and 4.0 E 21 atoms/cm$^3$. By including additional processing steps, the polysilicon layer 22 can include an upper metal silicide layer and an insulating cap layer, which are not depicted in the FIGS. to simplify the drawings.

Figure 9:
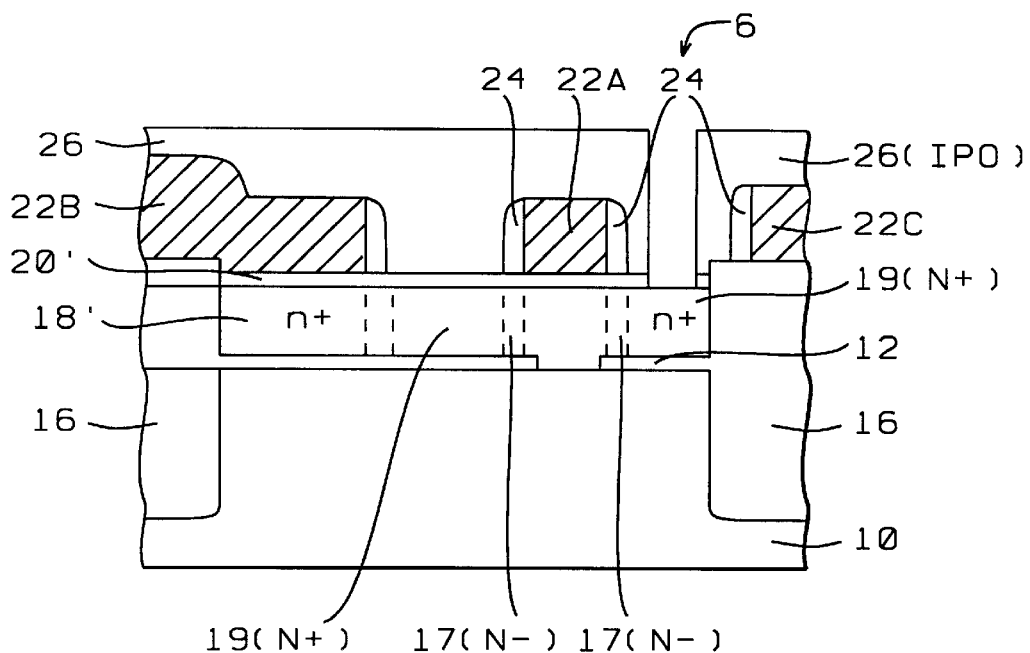

Referring to FIG. 9, conventional photolithographic techniques and anisotropic plasma etching are used to pattern the polysilicon layer 22 to form FET gate electrodes 22A over the openings 4 and also to form capacitor top electrodes 22B for the capacitors over the capacitor bottom electrodes 18'. The FET thin gate oxide 20 also serves as an interelectrode dielectric layer 20' for the flat capacitor. In addition, the polysilicon layer 22 can be concurrently patterned to form polysilicon resistors 22C on the shallow trench isolation 16.

Continuing with FIG. 9, lightly doped source/drain areas 17(N$^-$) are formed in the epitaxial layer 18 adjacent to the gate electrodes 22A. Typically the lightly doped source/drain areas are formed by ion implanting arsenic or phosphorus dopants, preferably arsenic, to achieve a dopant concentration of between about 1.0 E 18 and 2.0 E 20 atoms/cm$^3$. Next, insulating sidewall spacers 24 are formed on the gate electrodes 22A by depositing a conformal insulating layer consisting of a thin $SiO_x$ of about 150 Angstroms and a $Si_3N_4$ layer having a thickness of between about 500 and 1500 Angstroms, and more specifically a thickness of about 1000 Angstroms. The insulating sidewall spacers 24 are formed by anisotropically etching back. For example, the $SiO_x$ can be deposited by LPCVD using TEOS as the reactant gas, and the $Si_3N_4$ can be deposited by LPCVD using $SiCl_2H_2$ and ammonia ($NH_3$) as the reactant gases. The side-wall spacers 24 are formed by anisotropically etching back the $SiO_x/Si_3N_4$ layer using RIE and an etchant gas mixture such as $CHF_3$, $CF_4$, and $O_2$. The DRAM FETs are now completed by forming first and second source/drain contact areas 19(N$^+$), one on each side of the FET gate electrodes 22A adjacent to the sidewall spacers 24. The source/drain contact areas 19 are formed by implanting arsenic ions to achieve a dopant concentration of between about 1.0 E 19 and 4.0 E 21 atoms/cm$^3$. An important feature of this invention is that the dopant regions in the first source/drain contact areas 19(N$^+$) are contiguous with the doped capacitor bottom electrodes 18'.

Still referring to FIG. 9, an interpolysilicon oxide (IPO) layer 26 is deposited to insulate the underlying capacitor and FET devices. Layer 26 is a doped $SiO_2$ (doped, for example, with boron or phosphorus to a concentration of about 2 to 5%), and is deposited by sub-atmospheric CVD using, for example, TEOS/$O_3$ as the reactant gas. Layer 26 is planarized by CMP to have a thickness of between about 5000 and 6500 Angstroms over the capacitor top electrodes 22B. The novel DRAM cell is now completed up to the bit line contact openings by etching the bit line openings 6 in the IPO layer 26 to the second source/drain contact areas 19(N$^+$). The bit line openings 6 are etched using conventional photolithographic techniques and anisotropic plasma etching in a high-density plasma etcher.

Figure 10:
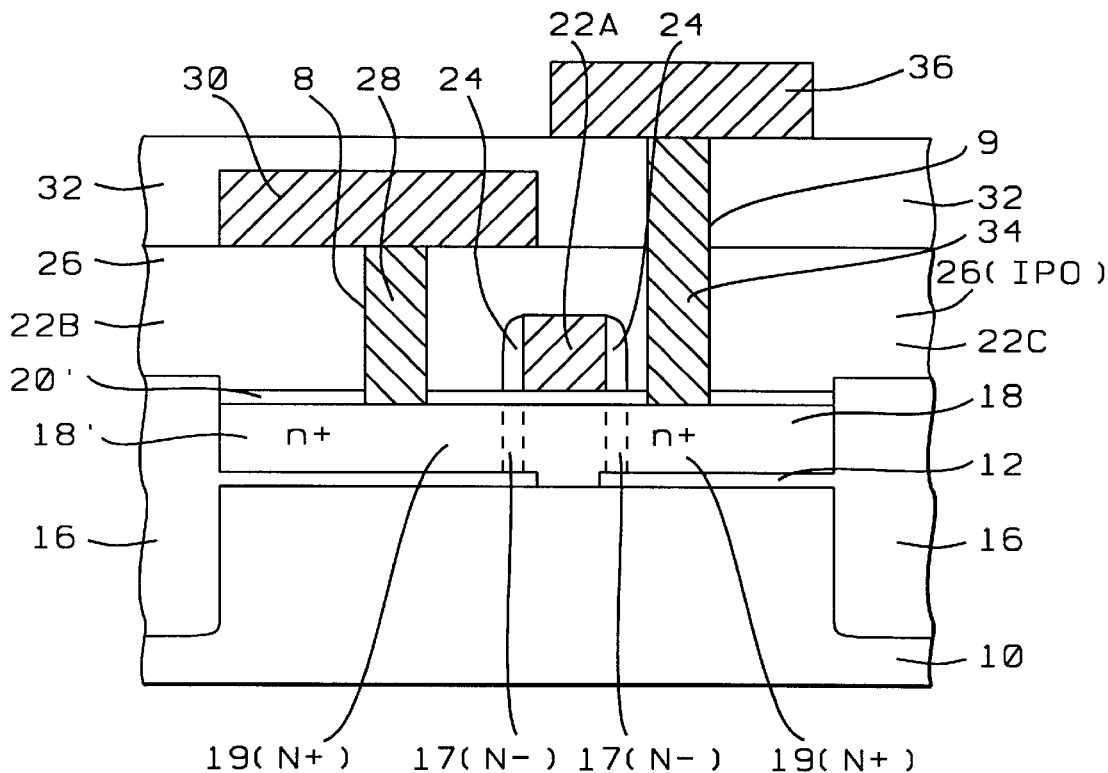
FIG. 10 shows a schematic cross-sectional view of one of the memory cells for the sequence of process steps for making the DRAM cell by the second embodiment using the selective epitaxial grown layer on an insulator.

Referring now to FIG. 10, in the second embodiment the process is identical to the first embodiment up to and including the deposition of the polysilicon layer 22 to form the gate electrodes. Similar elements in the drawings are labeled the same for both embodiments. The polysilicon layer 22 is deposited and patterned to form only the FET gate electrodes 22A over the openings in the first insulating layer 12. The top electrodes of the flat capacitor of the first embodiment are not formed in the second embodiment. The implant to form the bottom electrodes of the flat capacitors in the first embodiment is optional in the second embodiment, and can be eliminated to reduce process cost. The N$^-$ lightly doped source/drain areas 17(N$^-$) in the epitaxial layer 18 are implanted adjacent to the gate electrodes 22A. Insulating sidewall spacers 24 are formed on the gate electrodes, and N$^+$ doped first and second source/drain contact areas 19(N$^+$) are formed in the epitaxial layer 18 adjacent to the sidewall spacers 24 by ion implantation to complete the FETs. The process details for forming these elements are the same as in the first embodiment.

Continuing with the second embodiment and still referring to FIG. 10, the stacked capacitors are formed next. A first interpolysilicon oxide (IPO1) layer 26 is deposited. Layer 26 is preferably $SiO_2$, deposited by plasma-enhanced CVD using, for example, TEOS as the reactant gas. Layer 26 is planarized to have a thickness of between about 6500 and 8500 Angstroms over the FET gate electrodes 22A. First contact openings 8 are etched in the IPO1 layer 26 to the first source/drain contact areas 19(N$^+$) using anisotropic plasma etching, as described above. Capacitor node contacts 28 are formed in the first contact openings 8. For example, the node contacts 28 can be formed by depositing an N$^+$ doped polysilicon layer and polishing back to the surface of the IPO1 layer 26. The stacked capacitors 30 are then formed over the node contacts 28 by various means, as commonly practiced in the industry. For example, the stacked capacitors can include cylindrical-shaped, crown-shaped, fin-shaped, and the like, but are not explicitly depicted in FIG. 10 to simplify the drawing. A second interpolysilicon oxide (IPO2) layer 32 is deposited over the stacked capacitors 30. Layer 32 is deposited and planarized as for IPO1 layer 26, and has a thickness of between about 4000 and 6000 Angstroms over the stacked capacitors. Second contact openings 9 are etched in the IPO layers 32 and 26 to the second source/drain contact areas 19($N^+$) for bit lines. Conducting plugs 34 are formed in the second openings 9. For example, the plugs 34 are preferably formed by depositing a metal, such as aluminum (Al) or tungsten (W), and would include a barrier/adhesion layer such as titanium/titanium nitride (Ti/TiN) to prevent t metal from reacting with the silicon substrate. Next, a conducting layer 36 is deposited and patterned to form the bit lines 36 to complete the array of DRAM cells. The conducting layer 36 is preferably a multilayer of Ti/TiN/AlCu alloy/Ti/TiN. The Ti/TiN layers are deposited to a thickness of about 150 to 300 Angstroms, and the AlCu is deposited to a thickness of about 3500 to 4800 Angstroms.

While the invention has been particularly shown and described with reference to the preferred embodiments thereof, it will be understood by those skilled in the art that various changes in form and details may be made without departing from the spirit and scope of the invention.

What is claimed is:

1. A method for fabricating dynamic random access memory (DRAM) cells on and in an epitaxial silicon layer formed over a first insulating layer on a semiconductor substrate comprising the steps of:

forming said first insulating layer on said substrate;
   depositing a hard-mask layer on said first insulating layer;
   patterning said hard-mask layer and leaving portions over device areas, and using said hard mask for etching shallow trenches in said substate;
   depositing a second insulating layer to fill said shallow trenches and polishing hack to said hard-mask layer to form shallow trench isolation;
   selectively removing said hard-mask layer and forming recesses over and self-aligned to said device areas and exposing said first insulating layer in said recesses;
   etching openings in said first insulating layer over device areas to said substrate;
   growing selectively said epitaxial layer from said openings and extending laterally over said first insulating layer in said recesses;
   forming a gate oxide on said epitaxial layer;
   forming a doped polysilicon layer on said substrate;
   patterning said polysilicon layer to form FET gate electrodes over said openings, and implanting to form lightly doped source/drain areas in said epitaxial layer adjacent to said gate electrodes;
   forming insulating sidewall spacers on said gate electrodes, and implanting to form first and second source/drain contact areas adjacent to said sidewall spacers;
   forming capacitors electrically contacting said first source/drain contact areas and bit lines electrically contacting said second source/drain contact-areas to complete said DRAM cells.

2. The method of claim 1, wherein said semiconductor substrate is a P doped single-crystal silicon substrate.

3. The method of claim 1, wherein said first insulating layer is silicon oxide formed by thermal oxidation to a thickness of between about 100 and 200 Angstroms.

4. The method of claim 1, wherein said hard-mask layer is silicon nitride deposited by low-pressure chemical vapor deposition to a thickness of between about 1600 and 2000 Angstroms.

5. The method of claim 1, wherein said shallow trenches are etched to a depth of between about 2000 and 3300 Angstroms.

6. The method of claim 1, wherein said second insulating layer is silicon oxide deposited by low-pressure chemical vapor deposition and is polished back to form a field oxide which is coplanar with top surface of said hard mask.

7. The method of claim 1, wherein said epitaxial layer is formed in a reactor using a reactant gas selected from the group that includes $SiH_4$ and $SiH_2Cl_2$ at a temperature of between about 950 and 1100° C., and said epitaxial layer is formed to a thickness of between about 1000 and 5000 Angstroms.

8. The method of claim 1, wherein said gate oxide is formed by a dry thermal oxidation and is grown to a thickness of between about 15 and 35 Angstroms.

9. The method of claim 1, wherein said doped poly-silicon layer is deposited by low-pressure chemical vapor deposition using a reactant gas of $SiH_4$ and is doped $N^+$ by ion implantation to a final concentration of between about 1.0 E 19 and 4.0 E 21 atoms/$cm^3$.

10. The method of claim 1, wherein said sidewall spacers are silicon oxide/silicon nitride.

11. A method for fabricating dynamic random access memory (DRAM) cells on and in an epitaxial silicon layer formed over a first insulating layer on a semiconductor substrate comprising the steps of:

forming said first insulating layer on said substrate;
    depositing a hard-mask layer on said first insulating layer;
    patterning said hard-mask layer and leaving portions over device areas, and using said hard mask for etching shallow trenches in said substrate;
    depositing a second insulating layer to fill said shallow trenches and polishing back to said hard-mask layer to form shallow trench isolation;
    selectively removing said hard-mask layer and forming recesses over and self-aligned to said device areas and exposing said first insulating layer in said recesses;
    etching openings in said first insulating layer over said device areas to said substrate;
    growing selectively said epitaxial layer from said openings and extending laterally over said first insulating layer in said recesses;
    forming capacitor bottom electrodes in a portion of said epitaxial layer by doping;
    forming a gate oxide on said epitaxial layer;
    forming a doped polysilicon layer on said substrate;
    patterning said polysilicon layer to form FET gate electrodes over said openings and to form capacitor top electrodes for said capacitors over said capacitor bottom electrodes and patterning said polysilicon layer to form resistors over said shallow trench isolation;
    implanting to form lightly doped source/drain areas in said epitaxial layer adjacent to said gate electrodes;
    forming insulating sidewall spacers on said gate electrodes, and implanting to form first and second source/drain contact areas adjacent to said sidewall spacers, wherein said first source/drain contact areas are contiguous with said capacitor bottom electrodes;
    forming bit lines electrically contacting said second source/drain contact areas to complete said DRAM cells.

12. The method of claim 11, wherein said semiconductor substrate is a P doped single-crystal silicon substrate.

13. The method of claim 11, wherein said first insulating layer is silicon oxide formed by thermal oxidation to a thickness of between about 100 and 200 Angstroms.

14. The method of claim 11, wherein said hard-mask layer is silicon nitride deposited by low-pressure chemical vapor deposition to a thickness of between about 1600 and 2000 Angstroms.

15. The method of claim 11, wherein said shallow trenches are etched to a depth of between about 2000 and 3300 Angstroms.

16. The method of claim 11, wherein said second insulating layer is silicon oxide deposited by low-pressure chemical vapor deposition and is polished back to form a field oxide which is coplanar with top surface of said hard mask.

17. The method of claim 11, wherein said epitaxial layer is formed in a reactor using a reactant gas selected from the group that includes $SiH_4$ and $SiH_2Cl_2$ at a temperature of between about 950 and 1100° C., and said epitaxial layer is formed to a thickness of between about 1000 and 5000 Angstroms.

18. The method of claim 11, wherein said capacitor bottom electrodes are formed by doping using an ion implantation of phosphorus ions to achieve a final dopant concentration of between about 1.0 E 19 and 4.0 E 21 atoms/$cm^3$.

19. The method of claim 11, wherein said gate oxide is formed by a dry thermal oxidation and is grown to a thickness of between about 15 and 35 Angstroms.

20. The method of claim 11, wherein said doped polysilicon layer is deposited by low-pressure chemical vapor deposition using a reactant gas of $SiH_4$ and is doped $N^+$ by ion implantation to a final concentration of between about 1.0 E 19 and 4.0 E 21 atoms/$cm^3$.

21. The method of claim 11, wherein said sidewall spacers are silicon oxide/silicon nitride.

22. A method for fabricating dynamic random access memory (DRAM) cells on and in an epitaxial silicon layer formed over a first insulating layer on a semiconductor substrate comprising the steps of:

forming said first insulating layer on said substrate;

depositing a hard-mask layer on said first insulating layer;

patterning said hard-mask layer and leaving portions over device areas, and using said hard mask for etching shallow trenches in said substrate;

depositing a second insulating layer to fill said shallow trenches and polishing back to said hard-mask layer to form shallow trench isolation;

selectively removing said hard-mask layer and forming recesses over and self-aligned to said device areas and exposing said first insulating layer in said recesses;

etching openings in said first insulating layer over said device areas to said substrate;

growing selectively said epitaxial layer from said openings and extending laterally over said first insulating layer in said recesses;

forming a gate oxide on said epitaxial layer;

forming a doped polysilicon layer on said substrate;

patterning said polysilicon layer to form FET gate electrodes over said openings, and implanting to form lightly doped source/drain areas in said epitaxial layer adjacent to said gate electrodes;

forming insulating sidewall spacers on said gate electrodes, and implanting to form first and second source/drain contact areas adjacent to said sidewall spacers;

depositing a first interpolysilicon oxide (IPO1) layer and etching first contact openings to said first source/drain contact areas and forming stacked capacitors having node contacts in said first contact openings;

depositing a second interpolysilicon oxide (IPO2) layer and etching second contact openings to said second source/drain contact areas and forming bit line contact plugs in said second contact openings and forming bit lines to complete said DRAM cells.

23. The method of claim 22, wherein said semiconductor substrate is a P doped single-crystal silicon substrate.

24. The method of claim 22, wherein said first insulating layer is silicon oxide formed by thermal oxidation to a thickness of between about 100 and 200 Angstroms.

25. The method of claim 22, wherein said hard-mask layer is silicon nitride deposited by low-pressure chemical vapor deposition to a thickness of between about 1600 and 2000 Angstroms.

26. The method of claim 22, wherein said shallow trenches are etched to a depth of between about 2000 and 3300 Angstroms.

27. The method of claim 22, wherein said second insulating layer is silicon oxide deposited by low-pressure chemical vapor deposition and is polished back to form a field oxide which is coplanar with top surface of said hard mask.

28. The method of claim 22, wherein said epitaxial layer is formed in a reactor using a reactant gas selected from the group that includes $SiH_4$ and $SiH_2Cl_2$ at a temperature of between about 950 and 1100° C., and said epitaxial layer is formed to a thickness of between about 1000 and 5000 Angstroms.

29. The method of claim 22, wherein said gate oxide is formed by a dry thermal oxidation and is grown to a thickness of between about 15 and 35 Angstroms.

30. The method of claim 22, wherein said doped polysilicon layer is deposited by low-pressure chemical vapor deposition using a reactant gas of $SiH_4$ and is doped $N^+$ by ion implantation to a final concentration of between about 1.0 E 19 and 4.0 E 21 atoms/$cm^3$.

31. The method of claim 22, wherein said sidewall spacers are silicon oxide/silicon nitride.

32. The method of claim 22, wherein said first interpolysilicon oxide layer is silicon oxide deposited by chemical vapor deposition and planarized to a thickness sufficient to insulate said gate electrodes.

33. The method of claim 22, wherein said node contacts are formed from an $N^+$ doped polysilicon.

34. The method of claim 22, wherein said second interpolysilicon oxide layer is silicon oxide deposited by chemical vapor deposition and planarized to a thickness sufficient to insulate said capacitors.

35. The method of claim 22, wherein said bit lines are formed from an electrically conducting layer.

* * * * *